Oct. 1, 1968 H. KELLER 3,404,356

HOUSING FOR A SEMICONDUCTOR DIODE

Filed Feb. 17, 1966

INVENTOR
HANS KELLER

BY Percy P. Lantzy
ATTORNEY

United States Patent Office 3,404,356
Patented Oct. 1, 1968

3,404,356

HOUSING FOR A SEMICONDUCTOR DIODE

Hans Keller, Freiburg im Breisgau, Germany, assignor to International Standard Electric Corporation, New York, N.Y., a corporation of Delaware Filed Feb. 17, 1966, Ser. No. 528,198
Claims priority, application Germany, Apr. 3, 1965, J 27,832
8 Claims. (Cl. 333—83)

ABSTRACT OF THE DISCLOSURE

This is an arrangement for housing a semiconductor tuner diode. The diode is mounted in a hollow body open on one side. The open side of the body is sealed by a closure which has one portion adjacent the body and a second portion of a diameter less than the first portion. A conductive material is disposed on the outside of the second portion of the closure.

The present invention relates to a particular type of semiconductor components which are known as voltage-variable capacitors, varactors, or varicaps.

These semiconductor components are diodes which operate in the reverse direction, and which are constructed in such a way that their barrier layer capacitance will vary within as wide as possible limits upon varying the applied reverse voltage. Such types of voltage-variable capacitors are used among others, also as tuning elements instead of mechanically variable capacitors in tank or resonant circuits.

In ultra-high frequency engineering (microwave engineering) e.g. in UHF television tuners, cavity resonators are chiefly used as tank circuits. In view of the required relatively high capacitance deviation it was hitherto customary to use normal types of variable capacitors as the tuning elements in UHF tuners. Thanks to the further development of voltage-variable diodes it is also possible for some time to produce also in these types of diodes a sufficiently high capacitance deviation by way of voltage variations, and to manufacture components with a sufficiently small equivalent resistance.

The invention is based on the problem of assembling a semiconductor diode, in particular with respect to it being built into a housing, in such a way that it will satisfy the special requirements placed on a diode for being used as a tuning capacity in UHF tank circuits. The invention proposes a housing for a semiconductor diode which, via two lead-in conductors connected to the diode and extending through the housing, enables a D.C. power supply of the diode which is independent of the housing potential when alternatingly connecting one connecting terminal of the diode to the housing or chassis potential respectively; in particular the invention relates to a housing for building a voltage-variable diode (varicap) into a cavity resonator partly consisting of an insulating material provided with a coat of metal on its surface. According to the invention the part of the housing (header assembly) which envelops the first lead-in conductor (connecting terminal) of the diode, consists of an insulating material of high dielectric constant which, on its outer surface, is provided with a conductive coating or layer, with the housing capacity between the external conductor surrounded by the insulating material, and the conducting external coating or layer being several times greater than the back or reverse capacity of the diode.

Housings for semiconductor arrangements or devices, whose outer sides are coated with metal, are already known to the art. In most cases, however, the metallic layer serves mechanical purposes and as a protection against the penetration of humidity. For example, it is often used in combination with plastic housings. In another conventional type of arrangement the metallic or metallized surface simultaneously serves as the by-pass or bridging resistance. It is also known already to use a housing as a parallel capacity for the protection against overloading individual elements of series-connected rectifiers or chains of diodes. To this end, for example, two parts of a metal housing are insulated from one another by means of a dielectric, and several such parts are arranged in series parallel in relation to the individual diodes.

The present invention is aimed at achieving a different purpose. By the particular embodiment of the housing according to the invention it is achieved that the voltage-variable capacitor is connected with respect to alternating current, to mass or a chassis potential respectively and may thus, e.g. serve as the tuning element in a cavity resonator, whereas the D.C. voltage required for the necessary capacitance variation, is fed to the diode independently of the housing potential.

In the following the further advantages and features of the invention will be explained in detail with reference to the drawings, in which.

Figure 1:
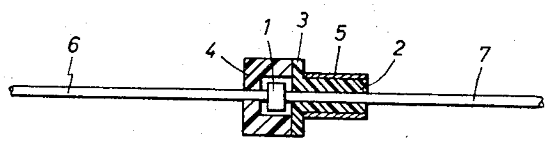
FIGURE 1 is the schematic representation of a voltage-variable capacitor arranged in a housing according to the invention.

In all figures corresponding parts are indicated by the same reference numerals. The diode 1 as shown in FIG. 1 may be e.g. a silicon diode manufactured either according to the alloying method or according to the planar technique, and which is designed with respect to a particularly large deviation of the backward or reverse capacity. Two coaxial lead-in conductors 6 and 7 are contacted thereto. The housing consists of a cover 4 through which the first lead-in 6 is led. The cover may either consist of insulating material or of metal. If the cover consists of metal, the lead-in 6 must be led therethrough in an insulated manner. The second lead-in 7 is led through the part of the housing 2 consisting of a material of a high as possible dielectric constant. To this end there may be used e.g. the commercially available ceramic materials or plastics. The upper portion of this part 2 of the housing is enlarged to form a set-off portion 3 on which the cover 4 rests, and to which the latter is firmly connected. The diode 1 may either likewise be mounted to this set-off portion, e.g. by the counter pressure of a resilient pressure contact which is connected to the lead-in 6 or, as shown in FIG. 1, is retained within the housing by the two lead-in conductors (terminals).

The portion 2 of the housing which directly envelops the lead-in conductor 7, is provided on its outer surface with a metallic layer 5.

The surface expansion of this layer 5 and the dielectric properties of the housing material at this point are chosen thus that the housing capacity developing between the lead-in 7 and the layer 5, is several times greater than the backward or reverse capacity of the diode. This housing capacity, in the case of usual types of designs, amounts to about 500 pf. and is thus about 10 to 100 times greater than the backward or reverse capacity of the diode. By providing this type of construction there will not appear the otherwise unavoidable series inductance reducing the upper cut-off or limit frequency with respect to the practical application of the diode. The capacitance between the poles of the diode is supposed to be kept as small as possible.

The housing of the diode according to FIG. 1 is so designed that it, with its lower portion 2, can be comfortably inserted into an opening provided in a chassis or other component, and may be electrically connected thereto. To this end the metallic coating or layer 5 may be provided with a thread fitting into a corresponding thread provided in a boring, or may be mounted with the aid of a nut subsequently to the insertion. The metallic layer may also consist of a solderable material for being soldered to that particular portion into which the diode is inserted. To this end the layer may consist e.g. of silver, which may then be soldered to other metals.

Figure 2:
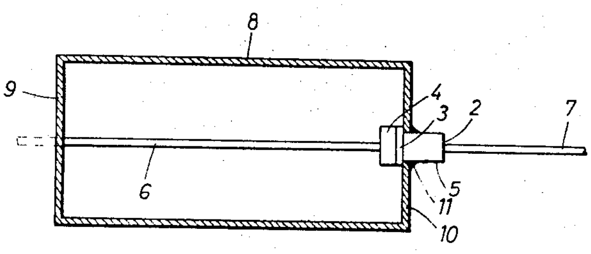
FIGURE 2 shows a cavity resonator into which there is inserted a diode with a housing designed according to the invention, for serving as the tuning element.

FIG. 2 shows a preferred type of practical application of the voltage variable capacitor with a housing according to the invention. The diode is inserted as a tuning capacity in a cavity resonator 8. To this end the one face side 10 of the cavity resonator has been provided with a bore into which the portion 2 of the diode housing which has a somewhat smaller diameter, can be either screwed or inserted. From the inside the diode is inserted in such a way into the cavity resonator that the portion 2 which is provided with the metallic layer, and the lead-in 7 extend outwardly through the bore. In cases where the metallic layer 5 is not provided with a thread, it may be soldered from the outside to the face side 10 of the cavity resonator as shown by the solder fillet 11. With its widened set-off portion 3, the diode housing rests in the inside on the edge of the bore provided in the face side 10. The lead-in conductor 6 of the voltage variable capacitor is made so long that it will reach to the opposite face side 9 of the cavity resonator, where it may be connected to the face side by way of soldering. The lead-in 6 thus simultaneously serves as the inner conductor of the cavity resonator 8. Alternatively the lead-in 6 may be left somewhat longer at first, and the face side 9 provided with a bore through which the lead-in 6 is led, and is soldered thereto. In this way the diode housing may be inserted in the cavity resonator without having to bend the lead-in conductors thereof to any noteworthy extent.

Figure 3:
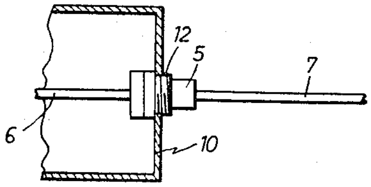
FIGURE 3 shows a cavity resonator where the diode housing is fastened to the cavity resonator by threaded means.

FIGURE 3 shows an embodiment of the invention where the conductive layer 5 is provided with a thread 12 and the diode housing 4 can be screwed into a matching threaded hole in the wall 10' of the cavity resonator 8 or there may be a clearance hole and the housing 4 held to the resonator wall by means of a locking nut (not shown).

In this way there is provided a uniform type of electrical component consisting of a cavity resonator with a voltage variable capacitor (diode) serving as the tuning element. The voltage required for the tuning purpose, may be fed to the voltage variable capacitor via the cavity resonator and the lead-in conductor 7 in a manner known to the art, whereas with respect to alternating current, the diode is lying, via the capacity, between the metallic layer 5 and the lead-in conductor 7 within the tank circuit itself.

The practical application of the voltage variable capacitor (varicap, diode) has been described with respect to its employment in a cavity resonator of the type as preferably used in UHF television tuners. Its practical application, however, is in no way restricted thereto. It may be used in all cases where a voltage variable capacitor is required which, with its one side, and with respect to alternating current, must be applied to a potential which is not equal to the D.C. potential.

While I have described above the principles of my invention in connection with specific apparatus, it is to be clearly understood that this description is made only by way of example and not as a limitation to the scope of my invention as set forth in the objects thereof and in the accompanying claims.

I claim:

1. An arrangement for tuning a resonant circuit comprising a housing, a diode disposed in said housing, first and second lead-in conductors coupled to said diode, said first lead-in conductor extending through said housing, said housing comprising a hollow body for containing said diode, a closure for said hollow body, said closure comprising a first portion adjacent said body and a second portion of a diameter less than the diameter of said first portion, said second lead-in conductor extending through said closure and conductive material disposed on the outside surface of said second portion.

2. An arrangement according to claim 1 wherein said closure comprises dielectric material.

3. An arrangement according to claim 1 wherein said conductive material consists of a solderable metal.

4. An arrangement according to claim 1 wherein said conductive layer is provided with a thread.

5. An arrangement according to claim 1 further comprising another housing, means disposing said housing within said other housing, means connecting said first lead-in conductor to one wall of said housing, and means coupling said housing to said other housing whereby said second lead-in conductor is disposed outside of said other housing and insulated therefrom.

6. An arrangement according to claim 5 wherein said other housing comprises a resonant cavity.

7. An arrangement according to claim 1 wherein the housing capacity between said second lead-in conductor and said conductive material is greater than the reverse capacity of said diode.

8. An arrangement according to claim 5 wherein said first lead-in conductor extends through said other housing so as to serve as the internal conductor of said cavity resonator.

References Cited

UNITED STATES PATENTS

| | | | |
|---|---|---|---|
| 3,108,239 | 10/1963 | Koueiter | 333—83 |
| 3,161,811 | 12/1964 | Brown. | |
| 3,217,213 | 11/1965 | Slater. | |
| 3,244,947 | 4/1966 | Slater. | |
| 3,271,698 | 9/1966 | Adams | 333—83 |

HERMAN KARL SAALBACH, *Primary Examiner.*

L. ALLAHUT, *Assistant Examiner.*